(12) United States Patent  
Gurgi et al.

(10) Patent No.: US 8,717,826 B1
(45) Date of Patent: May 6, 2014

(54) ESTIMATION OF MEMORY CELL WEAR LEVEL BASED ON SATURATION CURRENT

(71) Applicant: Apple Inc., Cupertino, CA (US)

(72) Inventors: Eyal Gurgi, Petah-Tikva (IL); Naftali Sommer, Rishon le-Zion (IL); Yael Shur, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 9 days.

(21) Appl. No.: 13/710,938

(22) Filed: Dec. 11, 2012

(51) Int. Cl.
G11C 11/34 (2006.01)
(52) U.S. Cl.
USPC .................................. 365/185.29; 365/185.24

(58) Field of Classification Search
USPC ........................................ 365/185.29, 185.24
See application file for complete search history.

(56) References Cited

U.S. PATENT DOCUMENTS

| 2010/0157671 A1* | 6/2010 | Mokhlesi ................. 365/185.03 |
| 2012/0167100 A1* | 6/2012 | Li et al. ......................... 718/102 |
| 2013/0158892 A1* | 6/2013 | Heron et al. .................... 702/34 |

* cited by examiner

Primary Examiner — Michael Tran
(74) Attorney, Agent, or Firm — Meyertons, Hood, Kivlin, Kowert & Goetzel, P.C.

(57) ABSTRACT

A method includes measuring a saturation current flowing through one or more analog memory cells. A wear level of the memory cells is deduced from the measured saturation current. Storage of data in the memory cells is configured based on the deduced wear level.

20 Claims, 3 Drawing Sheets

ESTIMATION OF MEMORY CELL WEAR LEVEL BASED ON SATURATION CURRENT

FIELD OF THE INVENTION

The present invention relates generally to memory devices, and particularly to methods and systems for estimating memory cell wear level.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

The performance of some types of analog memory cells deteriorates as a function of use (e.g., as a function of the number of Programming and Erasure (P/E) cycles applied to the cells). This property is sometimes referred to as cell wearing. Some data storage techniques attempt to distribute cell wearing evenly among different groups of memory cells. These techniques are commonly referred to as wear leveling techniques.

For example, U.S. Patent Application Publication 2007/0050536, whose disclosure is incorporated herein by reference, describes a system comprising a non-volatile memory, a controller and a wear leveling table. The non-volatile memory includes one or more memory blocks to store data. The controller allocates one or more of the memory blocks to store data. The wear-leveling table is populated with pointers to unallocated memory blocks in the non-volatile memory. The controller identifies one or more pointers in the wear-leveling table and allocates the unallocated memory blocks associated with the identified pointers for the storage of data.

U.S. Patent Application Publication 2006/0203546, whose disclosure is incorporated herein by reference, describes a method of achieving wear leveling in a Flash memory. For each block of the memory, a number is calculated that is a function of the number of times the block has been erased and of the number of times at least one other block has been erased. The numbers are stored in a memory device that includes the memory. The numbers are updated as needed when blocks are erased. Blocks are selected to be erased in accordance with their numbers.

PCT International Publication WO 2008/077284, whose disclosure is incorporated herein by reference, describes a wear leveling method for non-volatile memory. An embodiment includes counting erase cycles for each of a set of multiple memory blocks of a non-volatile memory, including incrementing a first count for a physical block address of the memory block. If the memory block is not a spare memory block, a second count for a logical block address of the memory block is incremented. The method also determines whether the memory has uneven wear of memory blocks based on the counting of the erase cycles of the plurality of memory blocks.

U.S. Patent Application Publication 2007/0208904, whose disclosure is incorporated herein by reference, describes a wear leveling apparatus, which uniformly distributes wear over a nonvolatile memory containing a plurality of memory blocks. The apparatus includes a memory unit for storing a record of cold block candidates in the nonvolatile memory and a control unit configured to update the memory unit and release the cold block candidates under a threshold condition. The control unit selects a new memory block to replace one cold block candidate in the memory unit when the cold block candidate is matched with a written address in a write command for the nonvolatile memory. The cold block candidates remaining in the memory unit are identified as cold blocks when the nonvolatile memory has been written more than a predetermined write count threshold. The memory blocks with infrequent erasure can be identified and released to uniformly distribute wear over the nonvolatile memory.

U.S. Pat. No. 6,230,233, whose disclosure is incorporated herein by reference, describes a mass storage system made of Flash memory cells organized into blocks, the blocks in turn being grouped into memory banks. The system is managed to even out the numbers of erase and rewrite cycles experienced by the memory banks in order to extend the service lifetime of the system.

Relative use of the memory banks is monitored and, in response to detection of uneven use, memory banks have their physical addresses periodically swapped for each other in order to even out their use over the lifetime of the memory.

U.S. Pat. No. 7,441,067, whose disclosure is incorporated herein by reference, describes a re-programmable non-volatile memory system, such as a Flash system, having its memory cells grouped into blocks of cells that are simultaneously erasable. The system is operated in a manner to level out the wear of the individual blocks through repetitive erasing and re-programming. Wear leveling may be accomplished without use of counts of the number of times the individual blocks experience erase and re-programming but such counts can optionally aid in carrying out the wear leveling process. Individual active physical blocks are chosen to be exchanged with those of an erased block pool in a predefined order.

SUMMARY OF THE INVENTION

An embodiment of the present invention that is described herein provides a method including measuring a saturation current flowing through one or more analog memory cells. A wear level of the memory cells is deduced from the measured saturation current. Storage of data in the memory cells is configured based on the deduced wear level.

In some embodiments, deducing the wear level includes estimating a retention time that elapsed since the memory cells were programmed, based on the saturation current and on a known number of programming and erasure cycles applied to the memory cells. In other embodiments, measuring the saturation current includes estimating the saturation current immediately after erasing the memory cells, and deducing the wear level includes assessing a number of programming and erasure cycles applied to the memory cells.

In a disclosed embodiment, measuring the saturation current includes allowing the memory cells to discharge starting from an initial voltage, assessing the discharge time of the memory cells, and deducing the saturation current from the discharge time. In an embodiment, the method includes assigning the one or more memory cells exclusively for measuring the saturation current. In another embodiment, the method includes choosing the one or more memory cells that are erased.

In yet another embodiment, the method includes setting a read voltage applied to the one or more cells so as to enable the memory cells to reach the saturation current. In still another embodiment, the method includes erasing the memory cells immediately before measuring the saturation current, and deducing the wear level includes assessing a number of programming and erasure cycles applied to the memory cells.

In some embodiments, measuring the saturation current includes measuring a current flowing through the memory cells when the memory cells are not saturated, and deriving the saturation current from the measured current. In an embodiment, measuring the saturation current includes determining the saturation current for a first group of memory cells, and deducing the wear level includes estimating the wear level for a second group of memory cells, different from the first group.

There is additionally provided, in accordance with an embodiment of the present invention, apparatus including one or more analog memory cells and storage circuitry. The storage circuitry is configured to measure a saturation current flowing through the one or more memory cells, to deduce a wear level of the memory cells from the measured saturation current, and to configure storage of data in the memory cells based on the deduced wear level.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for assessing the wear level of analog memory cells, such as Flash cells. The disclosed techniques measure the saturation current of a memory cell or group of memory cells, and use the saturation current as an indication for the cell wear level. Saturation current is a closely-related to cell wear level, because it reflects the quality of the memory cell physical media. In Flash memory cells, for example, saturation current is highly correlative to the quality of the cell oxide layer.

The disclosed techniques can be used for estimating various aspects of the cell wear level, such as the retention or endurance of the cells. The saturation current may be measured directly or indirectly, e.g., by measuring the time needed for the memory cells to discharge. Several example methods for measuring the saturation current, and for deducing the cell wear level from the measured saturation current, are described herein.

It is possible in principle to perform wear level estimation by tracking the numbers of Programming and Erasure (P/E) cycles applied to different groups of memory cells. This sort of solution is often inaccurate, for example because different cells may react differently to cycling. Moreover, tracking the number of P/E cycles requires considerable management effort and additional data structures. The disclosed techniques, in contrast, estimate the actual quality of the physical media of the memory cells, and are therefore highly accurate. Moreover, the disclosed techniques eliminate the need for the management and data structures needed for tracking numbers of P/E cycles.

System Description

Figure 1:
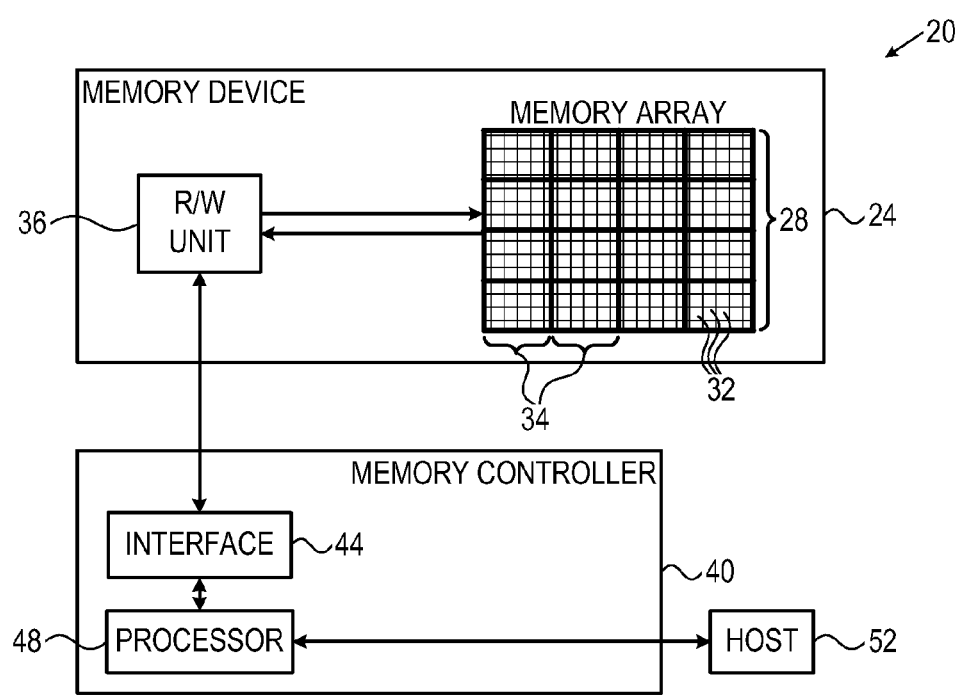
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for assessing the health levels or wear levels of memory cells 32 or groups of memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
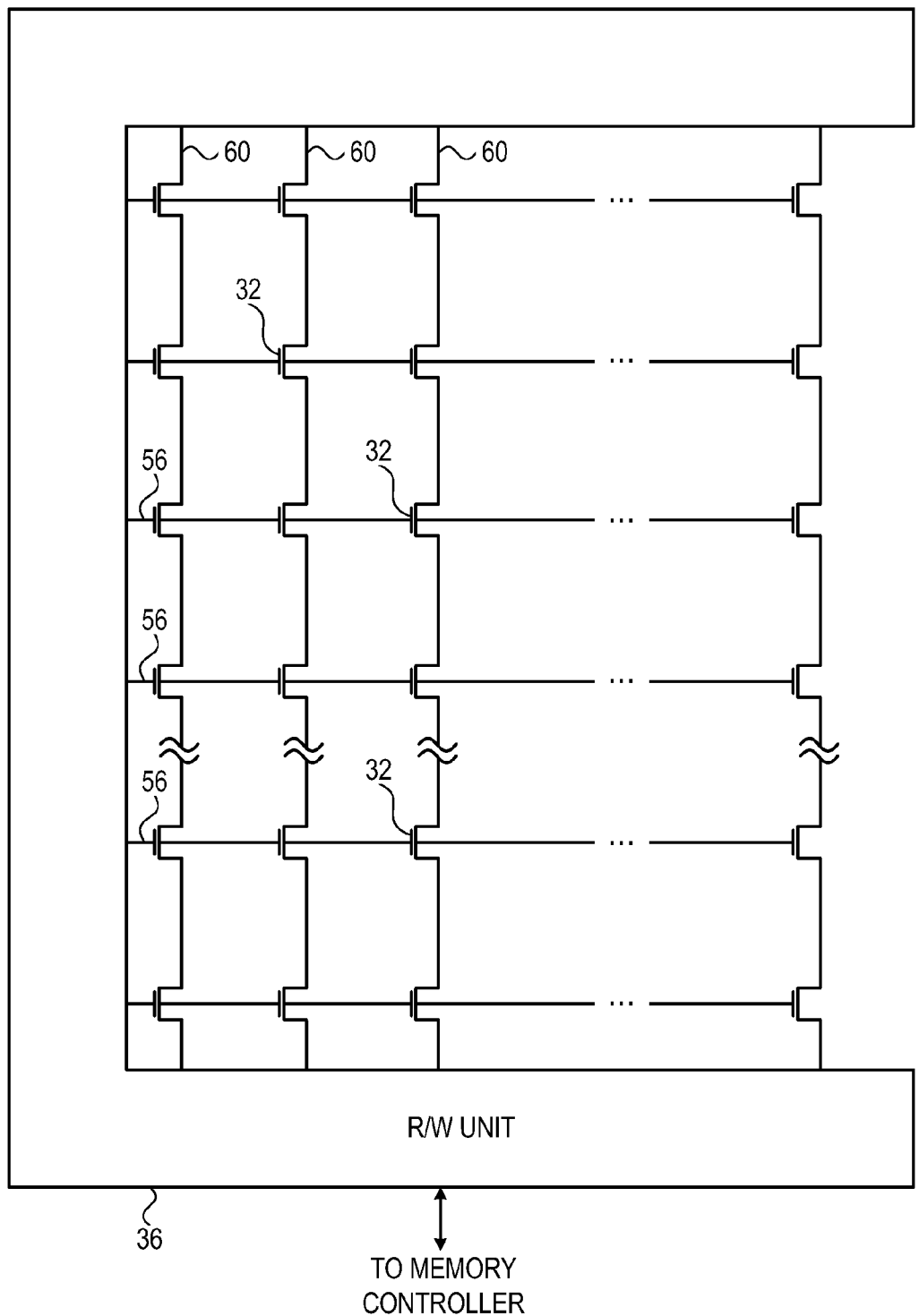
FIG. 2 is a block diagram that schematically illustrates a Read/Write (R/W) unit, in accordance with an embodiment of the present invention.

FIG. 2 is a block diagram that schematically illustrates R/W unit 36, in accordance with an embodiment of the present invention. As explained above, memory cells 32 are arranged in multiple rows and columns, and each memory cell comprises a floating-gate transistor. The gates of the cells in each row are connected by a respective word line 56, and the sources of the cells in each column are connected by a respective bit line 60. The memory cells (transistors) along each bit line 60 are connected source-to-drain in series with one another.

In alternative embodiments, the memory cells of a given word line are divided into groups that are referred to as strings. The memory cells in each string are connected source-to-drain in series with one another, between the bit line and ground. Each string can typically be connected and disconnected individually to the bit line.

In a typical embodiment, R/W unit 36 converts data for storage into analog storage values, applies the appropriate voltages to the bit lines and word lines of the memory, and writes the analog values into memory cells 32. When reading data out of memory cells 32, R/W unit 36 typically converts the analog values of the memory cells into digital samples.

R/W unit 36 is typically connected to memory controller 40 or other external system over a suitable interface.

It should be noted that the connectivity scheme of FIG. 2 is an example connectivity scheme, and that any other suitable connectivity scheme can be used in alternative embodiments, for example 3D schemes.

Relationship Between Cell Saturation Current and Wear Level

In some embodiments, processor 48 assesses the wear levels of groups of memory cells 32 based on measurements of memory cell saturation current. The description that follows refers mainly to measuring the saturation current of a cell string and estimating the string wear level, because in many memory devices it is only possible to measure the current of an entire string and not of an individual cell. The disclosed techniques, however, can also be used for individual memory cells or for any suitable cell group, such as a bit line, a string, a word line, a page or a memory block.

In the context of the present patent application and in the claims, the term "wear level" refers to various measures that are indicative of the quality of the physical media of the memory cells. Memory cells that are aged and whose physical media have deteriorated considerably will be regarded as having a high wear level, and vice versa. High wear level is usually associated with intensive use, e.g., a high number of Programming and Erasure (P/E) cycles. Typically, memory cells with high wear level will exhibit poor data storage reliability, e.g., high read error probability and high analog value drift over time.

Different types of analog memory cells deteriorate in different ways. A typical Flash memory cell, for example, comprises a charge storage layer that enables setting the cell threshold voltage ($V_{TH}$). The cell $V_{TH}$ depends on the amount of electrical charge (e.g., electrons) that are injected (or ejected) into (or out of) the floating gate through the oxide layer while an electric field is applied across the oxide layer. Programming and erasure of Flash cells are typically carried out using the Fowler-Nordheim (FN) tunneling mechanism. Therefore, a typical Flash memory cell operates almost continuously under FN current stress.

The tunnel oxide of Flash memory cells typically deteriorates during FN stress, for example due to oxide trap and interface trap generation. Interface trap generation continues to increase with increasing stress. The degradation in the quality of the oxide layer can be assessed and quantified by measuring the sub-$V_{TH}$ slope and trans-conductance degradation of the cell.

Typically, the cell resistance is strongly correlated to the overall stress experienced by the cell: Increasing the number of cycles increases the cell resistance, while increasing bake time (time spent at high temperature) decreases the cell resistance. When the memory cells are arranged in strings, the string current is limited by the resistance of the entire string, i.e., by the string saturation current. Therefore, there is strong correlation between the resistance of the cells in the string and the saturation current of the cell.

In summary, when multiple memory cells 32 are connected in cascade, source-to-drain, e.g., in a bit line or string, the saturation current of the bit line or string is indicative of the memory cells wear level. In the context of the present patent in the claims, the term "saturation current" of a cell or cell group refers to the asymptotic value to which the current flowing through the cell or cell group converges, when the voltage across the cell or cell group increases.

Figure 3:
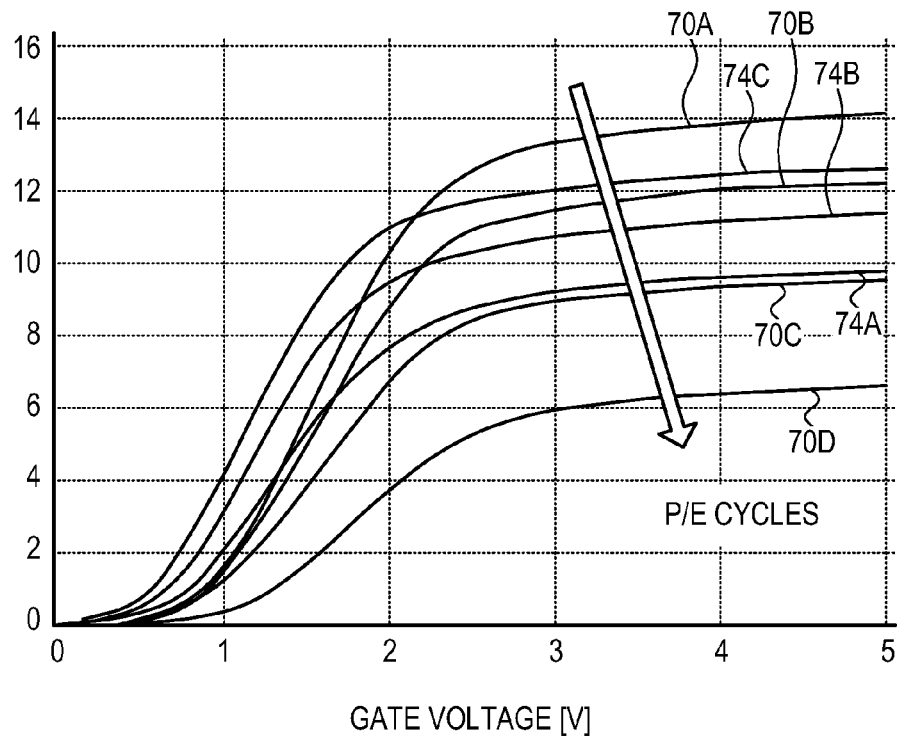
FIG. 3 is a graph showing memory cell voltage-current curves for various wear levels, in accordance with an embodiment of the present invention.

FIG. 3 is a graph showing measured voltage-current curves for various wear levels, in accordance with an embodiment of the present invention. The graph shows the voltage-current curves of a given string of NAND Flash memory cells, for different numbers of P/E cycles and bake times. In all the curves of FIG. 3, the string current converges asymptotically to a certain saturation current as the cell gate voltage increases.

Curves 70A . . . 70D show the voltage-current dependence of the string for an increasing number of P/E cycles, i.e., for various stages of the string's lifetime. As can be seen in the figure, the string saturation current decreases with cycling, i.e., with wear level. Curves 74A . . . 74C show the voltage-current dependence of the string following increasing bake time periods. As can be seen in the figure, the string saturation current increases bake time, i.e., decreases as the cell physical media improves.

The curves of FIG. 3 are chosen purely by way of example, in order to demonstrate the relationship between saturation current and wear level. Alternatively, any other suitable dependencies can be used. The string voltage-current dependence on cycling may vary from one NAND process to another and from one cell type (e.g., SLC/MLC) to another. The curves in FIG. 3 are typical, for example, of SLC devices fabricated using a 60 nm process or higher.

Wear Level Estimation Based on Saturation Current

In some embodiments, processor 48 of memory controller 40 assesses the wear level of a certain cell string, by measuring or estimating the string saturation current and deducing the wear level from the saturation current.

In particular, the saturation current is typically indicative of the combined endurance (number of P/E cycles) and retention (time that elapsed since the last programming) of the memory cells. For example, a cell having a high wear level will typically exhibit poor retention (fast $V_{TH}$ drift over time).

In an embodiment, the cell endurance figure is known, and processor 48 thus deduces the cell retention from the measured saturation current. In another embodiment, the retention figure is known, and processor deduces the cell endurance from the measured saturation current.

In yet another embodiment, the cell endurance is unknown. Processor 48 measures the cell saturation current immediately after erasure, i.e., with little or no retention, and deduces the endurance from the measured saturation current.

In different embodiments, processor 48 may measure the string saturation current in various ways. In an example embodiment, the processor estimates the string saturation current, and thus the wear level, by measuring the discharge time of the string.

Figure 4:
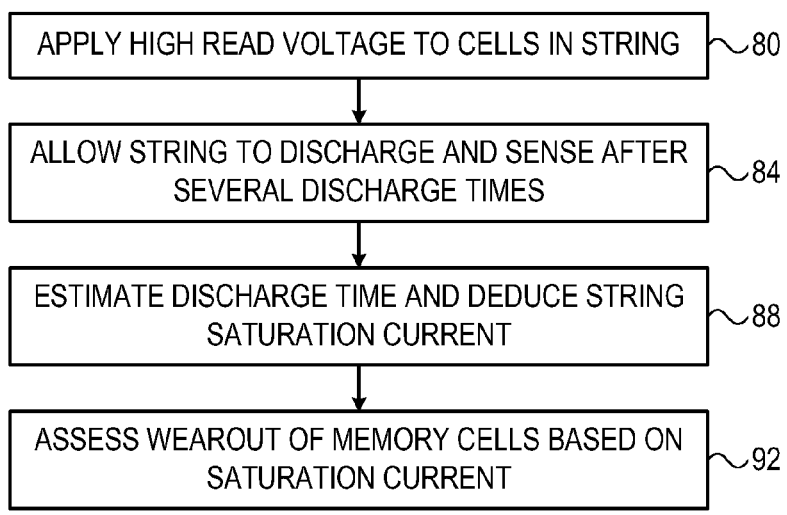
FIG. 4 is a flow chart that schematically illustrates a method for assessing memory device wear levels, in accordance with an embodiment of the present invention.

FIG. 4 is a flow chart that schematically illustrates a method for assessing memory device wear level, in accordance with an embodiment of the present invention. The method begins with R/W unit 36 to apply a high read voltage to the gates of the cells of a given string, at a gate biasing step 80. The read voltage is selected to be sufficiently high for the string current to reach or approach saturation.

At a string sensing step 84, R/W unit 36 charges the string to a certain initial voltage, allows the string to discharge starting from this initial voltage, and senses the string current at multiple time delays from the beginning of the discharge cycle.

From the multiple sense operations, R/W unit 36 or processor 48 determines the discharging time of the string up to a certain error, at a discharge time estimation step 88. Processor 48 then deduces the cell saturation current from the discharge time. At a wear level estimation step 92, processor 48 deduces the wear level of the string from the estimated saturation current.

The method of FIG. 4 is shown purely by way of example. In alternative embodiments, the storage circuitry in system 20 may estimate the cell wear level based on the discharge time in any other possible way. For example, the discharge time can be mapped directly to wear level, without explicit intermediate calculations of saturation current.

In some embodiments, before measuring saturation current, processor 48 erases the entire memory block 34, and controls the read voltage required for saturating the string current. In an embodiment, processor 48 estimates the cell retention by choosing strings whose cells are erased on programmed to small $V_{TH}$. This sort of selection ensures that a relatively small read voltage will be sufficient for saturating the string current.

In some embodiments, it is possible to assess the saturation current (and thus the wear level) by measuring the non-saturated string current, e.g., using a small read voltage that does not guarantee saturation. This sort of measurement, however, is typically less accurate than measurement of saturation current.

In some embodiments, processor 48 measures the saturation current for a first group of memory cells, and uses this measurement to deduce the wear level of a second group of cells (which may or may not include the first group). For example, the processor may measure the saturation current of a certain string, and use the measurement to deduce the wear level of the entire memory block to which the string belongs.

In an example embodiment, each memory block comprises a dedicated bit line for saturation current measurements. The endurance (number of erasures) of the dedicated bit line is equal to that of the block, since erasure is performed in entire block units. In one embodiment, the memory cells of the dedicated bit line are programmed prior to erasure. In another embodiment, the memory cells of the dedicated bit line are programmed to a known level during regular programming of the block. The latter technique helps processor 48 to determine the gate voltage that should be applied in order to measure the saturation current. These techniques provide highly accurate saturation current measurements, and therefore highly accurate wear level estimation.

Processor 48 may act upon the estimated wear levels of the different memory cells in various ways. Typically, processor 48 configures subsequent data storage in the memory cells in accordance with the estimated wear levels. For example, the processor may apply a suitable wear leveling scheme that distributes the wear-out evenly among the memory cells.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   measuring a saturation current flowing through one or more analog memory cells;
   deducing a wear level of the memory cells from the measured saturation current; and
   configuring storage of data in the memory cells based on the deduced wear level.

2. The method according to claim 1, wherein deducing the wear level comprises estimating a retention time that elapsed since the memory cells were programmed, based on the saturation current and on a known number of programming and erasure cycles applied to the memory cells.

3. The method according to claim 1, wherein measuring the saturation current comprises estimating the saturation current immediately after erasing the memory cells, and wherein deducing the wear level comprises assessing a number of programming and erasure cycles applied to the memory cells.

4. The method according to claim 1, wherein measuring the saturation current comprises allowing the memory cells to discharge starting from an initial voltage, assessing the discharge time of the memory cells, and deducing the saturation current from the discharge time.

5. The method according to claim 1, and comprising assigning the one or more memory cells exclusively for measuring the saturation current.

6. The method according to claim 1, and comprising choosing the one or more memory cells that are erased.

7. The method according to claim 1, and comprising setting a read voltage applied to the one or more cells so as to enable the memory cells to reach the saturation current.

8. The method according to claim 1, and comprising erasing the memory cells immediately before measuring the saturation current, wherein deducing the wear level comprises assessing a number of programming and erasure cycles applied to the memory cells.

9. The method according to claim 1, wherein measuring the saturation current comprises measuring a current flowing through the memory cells when the memory cells are not saturated, and deriving the saturation current from the measured current.

10. The method according to claim 1, wherein measuring the saturation current comprises determining the saturation current for a first group of memory cells, and wherein deducing the wear level comprises estimating the wear level for a second group of memory cells, different from the first group.

11. Apparatus, comprising:
    one or more analog memory cells; and
    storage circuitry, which is configured to measure a saturation current flowing through the one or more memory cells, to deduce a wear level of the memory cells from the measured saturation current, and to configure storage of data in the memory cells based on the deduced wear level.

12. The apparatus according to claim 11, wherein the storage circuitry is configured to estimate a retention time that elapsed since the memory cells were programmed, based on the saturation current and on a known number of programming and erasure cycles applied to the memory cells.

13. The apparatus according to claim 11, wherein the storage circuitry is configured to measure the saturation current immediately after erasing the memory cells, and to assess a number of programming and erasure cycles applied to the memory cells.

14. The apparatus according to claim 11, wherein the storage circuitry is configured to measure the saturation current by allowing the memory cells to discharge starting from an initial voltage, assessing the discharge time of the memory cells, and deducing the saturation current from the discharge time.

15. The apparatus according to claim 11, wherein the storage circuitry is configured to assign the one or more memory cells exclusively for measuring the saturation current.

16. The apparatus according to claim 11, wherein the storage circuitry is configured to choose the one or more memory cells that are erased.

17. The apparatus according to claim 11, wherein the storage circuitry is configured to set a read voltage applied to the one or more cells so as to enable the memory cells to reach the saturation current.

18. The apparatus according to claim 11, wherein the storage circuitry is configured to erase the memory cells immediately before measuring the saturation current, and then to assess a number of programming and erasure cycles applied to the memory cells.

19. The apparatus according to claim 11, wherein the storage circuitry is configured to measure a current flowing through the memory cells when the memory cells are not saturated, and to derive the saturation current from the measured current.

20. The apparatus according to claim 11, wherein the storage circuitry is configured to determine the saturation current for a first group of memory cells, and to estimate the wear level for a second group of memory cells, different from the first group.

* * * * *